US009703126B2

(12) United States Patent
Bergmann et al.

(10) Patent No.: US 9,703,126 B2
(45) Date of Patent: Jul. 11, 2017

(54) POCKELS CELL DRIVER CIRCUIT WITH INDUCTANCES (71) Applicants: Bergmann Messgeraete Entwicklung KG, Murnau (DE); Helmholtz-Zentrum Dresden-Rossendorf e.V., Dresden (DE)

(72) Inventors: Thorald Horst Bergmann, Murnau (DE); Mathias Siebold, Dresden (DE); Markus Löser, Dresden (DE)

(73) Assignee: BERGMANN MESSGERAETE ENTWICKLUNG KG, Dresden (DE)

(*) Notice: Subject to any disclaimer, the term of this patent is extended or adjusted under 35 U.S.C. 154(b) by 0 days.

(21) Appl. No.: 14/949,038

(22) Filed: Nov. 23, 2015

(65) Prior Publication Data
US 2016/0170243 A1 Jun. 16, 2016

(30) Foreign Application Priority Data

Nov. 24, 2014 (EP) ..................... 14194531

(51) Int. Cl.
*G02F 1/03* (2006.01)
*H03K 3/00* (2006.01)
*H01S 3/10* (2006.01)
*H01S 3/107* (2006.01)
*H03K 5/02* (2006.01)
(Continued)

(52) U.S. Cl.
CPC ............ *G02F 1/0327* (2013.01); *H01S 3/107* (2013.01); *G02F 1/03* (2013.01); *G02F 1/0305* (2013.01); *H01S 3/1103* (2013.01); *H03K 3/00* (2013.01); *H03K 5/02* (2013.01); *H03K 5/04* (2013.01)

(58) Field of Classification Search
CPC ........ G02F 1/0305; G02F 1/0327; G02F 1/05; G02F 1/061; G02F 1/03; H01S 3/0007; H01S 3/005; H01S 3/05; H01S 3/08; H01S 3/107; H01S 3/11; H01S 3/1103; H01S 3/1127; H01S 3/115; H03K 3/00; H03K 3/57; H03K 4/00; H03K 5/00; H03K 5/01; H03K 5/02; H03K 5/04; H03K 3/55; H03K 5/07; B23K 26/02; B23K 26/06; B23K 26/062; B23K 26/0622
USPC ..... 359/248, 257, 264; 372/25, 30; 327/111, 327/112, 174, 177, 179, 304; 307/106, 307/108; 324/754.27, 762.01
See application file for complete search history.

(56) References Cited

U.S. PATENT DOCUMENTS 3,879,687 A 4/1975 Daehlin et al.
3,931,528 A * 1/1976 Farnsworth ............. H03K 3/57
307/106

(Continued)

FOREIGN PATENT DOCUMENTS

WO 2014027227 A1 2/2014

OTHER PUBLICATIONS

International Search Report cited in EP Application No. 14194531.1 dated Jun. 10, 2015, pp. 1-7.

*Primary Examiner* — Loha Ben
(74) *Attorney, Agent, or Firm* — Cooper Legal Group, LLC (57) ABSTRACT The driver circuit contains a first line, which is to be connected to a first terminal of the Pockels cell (18; PC), and a second line, which is to be connected to a second terminal of the Pockels cell (18; PC), wherein the first line and/or the second line have/has an inductance (14, 15; 24, 25).

23 Claims, 10 Drawing Sheets (51) Int. Cl.
*H03K 5/04* (2006.01)
*H01S 3/11* (2006.01)

(56) References Cited

U.S. PATENT DOCUMENTS

| | | | | |
|---|---|---|---|---|
| 4,620,113 | A | * 10/1986 | Sizer, II | ........... H03K 3/55 327/111 |
| 5,189,547 | A | 2/1993 | Day et al. | |
| 5,394,415 | A | * 2/1995 | Zucker | ........... G02F 1/0126 372/10 |
| 5,594,378 | A | * 1/1997 | Kruse | ........... H03K 17/102 307/106 |
| 6,850,080 | B2 | * 2/2005 | Hiroki | ........... G09G 3/006 324/754.27 |
| 7,532,018 | B2 | * 5/2009 | Hiroki | ........... G09G 3/006 324/754.29 |
| 7,902,845 | B2 | * 3/2011 | Hiroki | ........... G09G 3/006 324/750.15 |
| 8,536,929 | B2 | * 9/2013 | Bergmann | ........... H01S 3/107 327/427 |
| 9,306,368 | B2 | * 4/2016 | Jonuska | ........... G02F 1/0327 |
| 2008/0018977 | A1 | 1/2008 | Bergmann et al. | |

* cited by examiner

POCKELS CELL DRIVER CIRCUIT WITH INDUCTANCES

RELATED APPLICATION

This application claims priority to European Patent Application 14194531.1, filed on Nov. 24, 2014, which is incorporated herein by reference.

DESCRIPTION

The present invention relates to a driver circuit for a Pockels cell, to a Pockels cell comprising such a driver circuit, and to a laser system comprising a Pockels cell and such a driver circuit.

In laser systems, electro-optical modulators such as Pockels cells can be used for switching or selecting laser pulses. A Pockels cell can be switched back and forth between two states by means of a suitable switchable high-voltage supply. The voltage required to attain the two states respectively mentioned is a function of the crystal parameters and the used wavelength of the light to be switched. In many applications, it is important to obtain the fastest possible switching times. However, there are also situations in which it is advantageous if at least one of the two switching times is slower than would be possible by means of the switching element itself, that is to say generally the transistor. A Pockels cell can be used as a cavity dumper for example within a laser resonator. In this case, it may be desirable to lengthen the pulse coupled out from the resonator by the cavity dumper and to reduce its peak intensity. This can be achieved by lengthening the switching times of the driver circuit of the Pockels cell. It may likewise be desirable for an originally rectangular laser pulse, the amplitude of which has been distorted after passage through an amplifier circuit, to be corrected by suitable variation of the voltage applied to the Pockels cell, in order to obtain the originally rectangular shape again. Accordingly, driver circuits are required in which at least one of the switching edges or a portion of said switching edge is made slower than would be permitted by normal switching elements, or is influenced in a specific manner in terms of its amplitude in comparison with normal switching elements.

It is therefore an object of the present invention to specify a driver circuit for a Pockels cell with which the temporal profile of a voltage applied to the Pockels cell can be influenced in a targeted manner. In particular, it is an object of the present invention to specify a driver circuit for a Pockels cell with which at least one switching edge can be delayed or a portion of said switching edge is delayed or influenced in terms of its amplitude, and/or, if necessary, the voltage between the two switching edges can be varied in a desired manner.

This object is achieved by means of the features of patent claim 1. Advantageous developments and embodiments are the subject matter of dependent claims or alternative independent claims.

The accompanying drawings are provided to ensure a further understanding of embodiments and are integrated into the present description and form part thereof. The drawings show embodiments and together with the description serve for elucidating principles of embodiments.

Insofar as the following description, the patent claims or the drawings express that circuit elements are "connected", "electrically connected" or "electrically coupled" to one another, this can mean that the elements mentioned are coupled to one another directly, i.e. without further elements situated therebetween. However, it can also mean that the elements mentioned are not directly coupled to one another and that further elements are coupled between the elements mentioned. Insofar as identical reference signs are used in the figures, they refer to identical or functionally identical elements, and so the description of these elements is not repeated in these cases. In the context of this application, the term "inductance" is also used synonymously with the term "inductance component", the term "resistance" is also used synonymously with the term "resistance component", and the term "capacitor" is also used synonymously with the term "capacitor component".

One exemplary driver circuit for a Pockels cell contains a first line, which is to be connected to a first terminal of the Pockels cell, and a second line, which is to be connected to a second terminal of the Pockels cell, wherein one or both of the first line and the second line has/have an inductance, in particular an inductance or an inductance component is incorporated into the first line and/or the second line.

In laser systems the problem frequently arises that a for example rectangular laser pulse, the radiation power or intensity of which at the instant t0 rises from the amplitude zero to a specific amplitude A within a short time, e.g. a few nsec or psec, keeps this amplitude A constant for a relatively long time, e.g. a few nsec to a few hundred nsec, and then in turn at the instant t1 falls to zero again within a short time, e.g. a few nsec or psec, and experiences an undesired deformation upon passing through a gain medium on account of the decrease in the gain (gain depletion), which deformation substantially consists of the fact that the output radiation power B, which should be kept constant over a relatively long time, slowly falls between the instants t0 and t1. This decrease can amount to a few percent, but it is also possible for the radiation power at the instant t1 to be only a small fraction of the radiation power at the instant t0. One possible solution to this problem might consist in suitably deforming the laser pulse before entrance into the gain medium, namely generating at the instant t0 a fast rise within a short time, e.g. a few nsec or psec, from the radiation power zero to a specific first smaller radiation power A1, this radiation power A1 then not being constant, but rather rising to a larger radiation power A2 within the pulse duration, a few nsec to a few hundred nsec from t0 to t1, and then in turn at the instant t1 falling to zero again within a short time, e.g. a few nsec or psec. With a pulse deformed in this way at the entrance of the gain medium, it is possible to obtain an amplified laser pulse having a substantially rectangular or time-symmetrical profile. The driver circuit presented in this application is suitable in particular for this use, wherein the fact that the deformed rising edge has a positive curvature of the intensity-time or voltage-time function has an advantageous effect for the compensation of the gain depletion. Generally, the driver circuit presented in this application makes it possible to shape a long or short rising edge in such a way that it has a long, in particular exponentially rising, rising edge with a length of up to a few hundred ns, wherein the length can depend, inter alia, on the choice of the inductance value of the at least one inductance.

In accordance with one embodiment of the driver circuit, the latter comprises, in one or both of the first line and the second line, a capacitor connected in parallel with the inductance (L1, L2) and/or a diode connected in parallel with the inductance (L1, L2). The capacitor and the diode are, in particular, a high-voltage capacitor and a high-voltage diode, respectively, that is to say components which are designed for operation at voltages in the kV range.

In accordance with one embodiment of the driver circuit, the latter is furthermore embodied in such a way that a voltage pulse which has a rising edge in the nanoseconds or subnanoseconds range (rectilinear/non-curved and also curved/exponential rise possible), an exponentially rising section adjacent thereto, and a falling edge adjacent thereto in the nanoseconds range is generatable by the driver circuit, wherein "nanoseconds or subnanoseconds range" can be taken to mean a range of 0.1 ns-10 ns and the exponentially rising section can have a time duration in the range of 1 ns to a few (e.g. factor of 5-10) 100 ns. In order to achieve this, by way of example, one or both of the first line and the second line can have a capacitor and/or diode connected in parallel with the inductance. In this case, the capacitance value of the capacitor or capacitors can be in a range below the capacitance values of commercially available high-voltage capacitors, in particular below ≤0.1 nF or below 10 pF. At the instant t0 of the voltage being switched on by the driver circuit, the intrinsic capacitance of the reverse-biased diode can be used to achieve at least part of the voltage jump at t0. If the intrinsic capacitance of the diode is too small, a normal high-voltage capacitor must additionally be connected in parallel. At the instant t1 of the voltage being switched off by the driver circuit, the then forward-biased diode serves for rapidly discharging the Pockels cell PC.

It is likewise possible to implement the polarity of the diode such that at the instant t0 of the voltage being switched on the diode is forward-biased and the full voltage jump is transferred to the Pockels cell PC, and that at the instant t1 of the voltage being switched off the diode is reverse-biased, as a result of which firstly only part of the voltage jump is transferred to the Pockels cell PC, and then the Pockels cell is slowly discharged, whereby the coupled-out laser pulse can be widened in a cavity dumper.

In accordance with one embodiment, the first and/or the second line have/has a resistance, wherein a resistance or a resistance component is incorporated in particular into the first line and/or the second line. Such a resistance can be used to damp undesired oscillations that possibly occur. In this case, provision can be made for the resistance to be coupled between the inductance and the respective terminal of the Pockels cell. However, provision can likewise be made for the inductance to be coupled between the resistance and the respective node point of the switching units.

In accordance with one embodiment of the driver circuit, the inductance value depending on the length of the voltage pulse to be shaped of from a few (e.g. factor of 1-10) nanoseconds to a few (e.g. factor of 1-10) hundred nanoseconds of one or both of the inductances is in a range of approximately 1 pH to a few (e.g. factor of 1-10) 10 mH.

In accordance with one embodiment of the driver circuit, the inductance comprises a simple cylindrical coil.

In accordance with one embodiment of the driver circuit, the inductance value of the inductance or, if present, of both inductances is adjustable. For this purpose, the inductance can comprise ferrites, for example, which are operated in saturation. What can thereby be achieved is that the curvature of the voltage/time curve turns out to be even greater than in the case of a normal inductance, particularly if the ferrite attains saturation.

In accordance with one embodiment of the driver circuit, the resistance value of the resistances inserted into the first or second line depending on the length of the voltage pulse to be shaped and depending on the dimensioning of the inductance is in a range of approximately 100 ohms to a few 10 kohms.

In accordance with one embodiment of the driver circuit, the latter is embodied as a push-pull circuit and for this purpose contains a circuit node connected to the first line, which circuit node is to be connected to a first potential by a third line via a first switching unit, and which circuit node is to be connected to a second potential by a fourth line via a second switching unit, wherein the second line is to be connected to a third potential. The second potential and the third potential can be identical to one another. Such a push-pull circuit is described in greater detail further below with reference to FIG. 1.

In accordance with one embodiment of the driver circuit, the latter is embodied as a bridge circuit and for this purpose contains a first circuit node connected to the first line, which first circuit node is to be connected to a first potential by a third line via a first switching unit, and which first circuit node is to be connected to a second potential by a fourth line via a second switching unit, and furthermore a second circuit node, which is to be connected to the second terminal of the Pockels cell by the second line, and which is to be connected to a third potential by a fifth line via a third switching unit, and which is to be connected to a fourth potential by a sixth line via a fourth switching unit.

In accordance with one embodiment of such a bridge circuit, the first potential and the third potential are identical to one another, in particular given by the positive potential of a voltage source, and the second potential and the fourth potential are identical to one another, in particular given by a ground potential. Such a switching mode of a bridge circuit is also referred to as dpp mode and is described in greater detail further below with reference to FIG. 3.

In accordance with one embodiment of the bridge circuit, the first potential is more positive than the second potential, and the third potential is more positive than the fourth potential, wherein the difference between the first potential and the fourth potential is greater than the difference between the first potential and the second potential, and wherein the difference between the first potential and the fourth potential is greater than the difference between the third potential and the fourth potential. In accordance with a further embodiment thereof, the first potential is provided by the positive pole of a voltage source and the fourth potential is provided by the negative pole of the voltage source. In accordance with a further embodiment, the second potential and the third potential are identical to one another and can be given in particular by a ground potential. In accordance with an alternative embodiment, the second potential and the third potential can be different from one another. These two conceivable embodiments of a bridge circuit are also referred to as bpp mode and are described in greater detail further below with reference to FIGS. 5 and 7.

Figure 1:
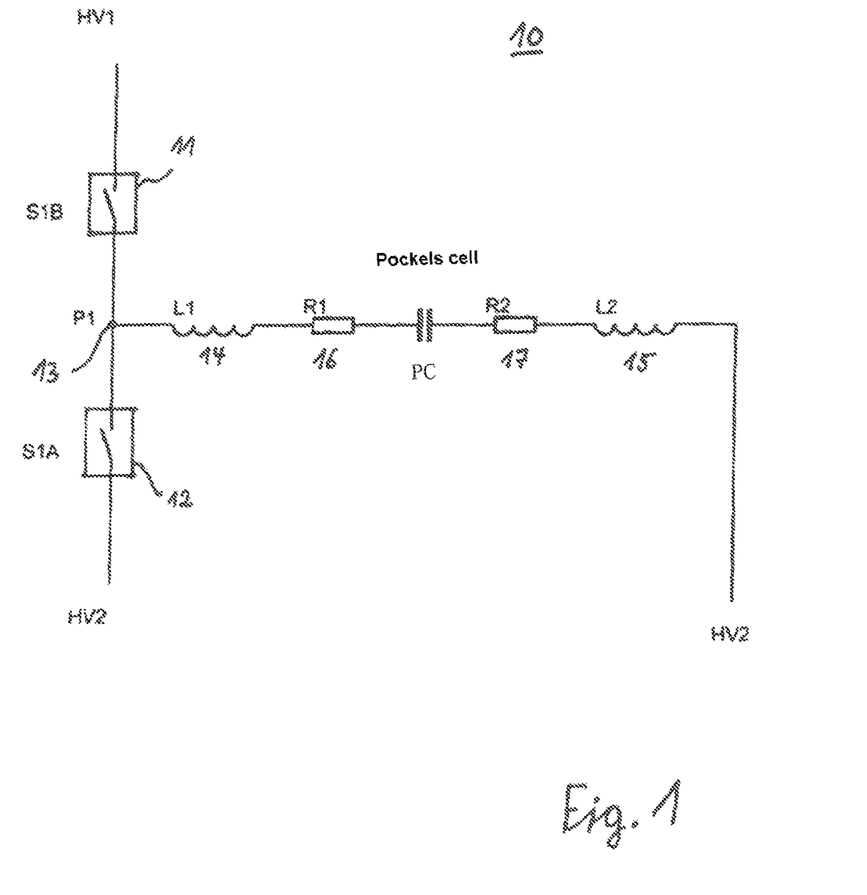
FIG. 1 shows a schematic illustration of a driver circuit in the form of a push-pull circuit in accordance with one embodiment without parallel-connected capacitors or diodes.

FIG. 1 schematically illustrates one embodiment of a driver circuit in the form of a push-pull circuit. The push-pull circuit 10 comprises a first switching unit 11 and a second switching unit 12. The switching units 11 and 12 are connected in series between a first electrical potential HV1 and a second electrical potential HV2, wherein the first potential HV1 can be provided by the positive pole of a voltage source and the second potential HV2 can be provided by the negative pole of the voltage source. The second potential HV2 can also be given by a ground terminal GND.

The two switching units 11 and 12 can be provided by a simple transistor or a transistor chain with regard to their internal construction.

The first switching unit 11 is connected to the first electrical potential HV1 by its first terminal and to a circuit node 13 by its second terminal. The second switching unit 12 is connected to the circuit node 13 by its first terminal and to the second electrical potential HV2 by its second terminal. The circuit node 13 is in turn connected to a first terminal of a first inductance 14 (L1). A second terminal of the inductance 14 is connected to a first terminal of a first resistance 16 (R1). The second terminal of the resistance 16 is connected to a first terminal of a Pockels cell PC. The second terminal of the Pockels cell is connected to a first terminal of a second resistance 17 (R2). The second terminal of the resistance 17 is connected to a first terminal of a second inductance 15 (L2). The second terminal of the second inductance 15 is connected to the second electrical potential HV2. The resistances 16 and 17 are merely optional and can also be omitted. They can serve to damp undesired oscillations that possibly occur. Provision can also be made for only one of the two resistances 16 and 17 to be present.

The push-pull circuit 10 is operated in such a way that one of the two switching units 11 and 12 is always closed, while the respective other of the two switching units 11 and 12 is open. If the switching unit 12 is closed and the switching unit 11 is open, then the Pockels cell PC is voltageless. Conversely, following a time or time-voltage curve determined by L1, L2, R1, R2 and the capacitance of the Pockels cell PC, the entire high voltage is present at the Pockels cell PC. If the switching unit 12 is then once again closed and the switching unit 11 opened, the Pockels cell PC is voltageless again following a time or time-voltage curve determined by L1, L2, R1, R2 and the capacitance of the Pockels cell PC. In the simplest case, each of the two switching units 11 and 12 can be provided by a simple transistor or by a transistor chain. In this case, each of the switching units 11 and 12 provides undelayed switching edges since each transistor can switch as rapidly as corresponds to its construction and its capabilities.

The switching units 11 and 12 can substantially consist of a transistor chain comprising N MOS field effect transistors (MOSFETs) that are connected in series with regard to their source/drain paths. The MOSFETs can be switched on and off by known charging/discharging circuits respectively connected to the gate and source terminals of the MOSFETs. Such an arrangement is embodied as a high-voltage switch. High-voltage switches can switch voltages of up to a few kilovolts or a few 10 kilovolts. The switching times of such high-voltage switches are in the range of a few nanoseconds and can be driven for example by TTL signals having a signal level of a few volts. The internal construction of said high-voltage switches, in particular of the charging/discharging circuits CLN, is described for example in DE 3630775 C2 and therefore need not be discussed in greater detail in the present case.

Figure 2:
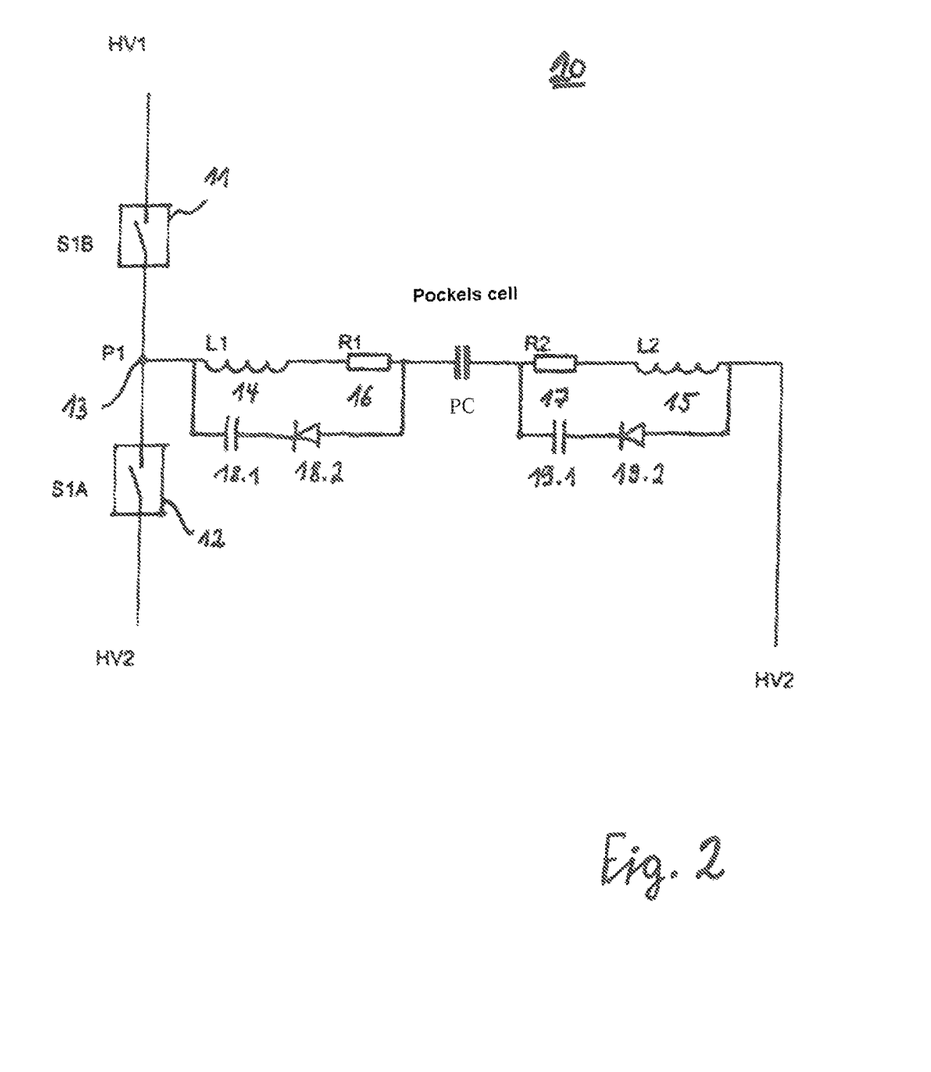
FIG. 2 shows a schematic illustration of a driver circuit in the form of a push-pull circuit in accordance with one embodiment with capacitors and/or diodes.

FIG. 2 schematically illustrates one embodiment of a driver circuit in the form of a push-pull circuit. The embodiment 20 in FIG. 2 differs from the embodiment in FIG. 1 merely in that a first capacitor 18.1 and/or a first diode 18.2 are/is connected in parallel with the series circuit formed by the first inductance 14 and the first resistance 16, and a second capacitor 19.1 and/or a second diode 19.2 are/is connected in parallel with the series circuit formed by the second inductance 15 and the second resistance 17. In accordance with the drawing, both the capacitors and the diodes are used, but it may be sufficient to use only one of the two in each case. Provision can also be made for the two lines to be connected up differently, that is to say for example for a capacitor to be used in the first line and a diode in the second line (or vice versa). The diodes 18.2, 19.2 are depicted in the reverse direction, wherein this relates to the switching-on instant t0. As already explained above, provision can also be made for the diodes to be forward-biased at the instant t0.

In this case, the capacitance values of the capacitors 18.1, 19.1 and/or of the diodes 18.2, 19.2 are in particular very low, in particular below 100 pF. Provision can also be made for only one of the two capacitors 18.1, 19.1 and/or diodes 18.2, 19.2 to be present. The capacitors 18.1, 19.1 and/or diodes 18.2, 19.2 serve to transfer part of the fast switching edge of the switching units 11 and 12 to the Pockels cell PC. They also influence the curve shape of the slow voltage rise. The diodes 18.2, 19.2 serve, in particular, for rapidly discharging the Pockels cell PC at the instant t1.

Figure 3:
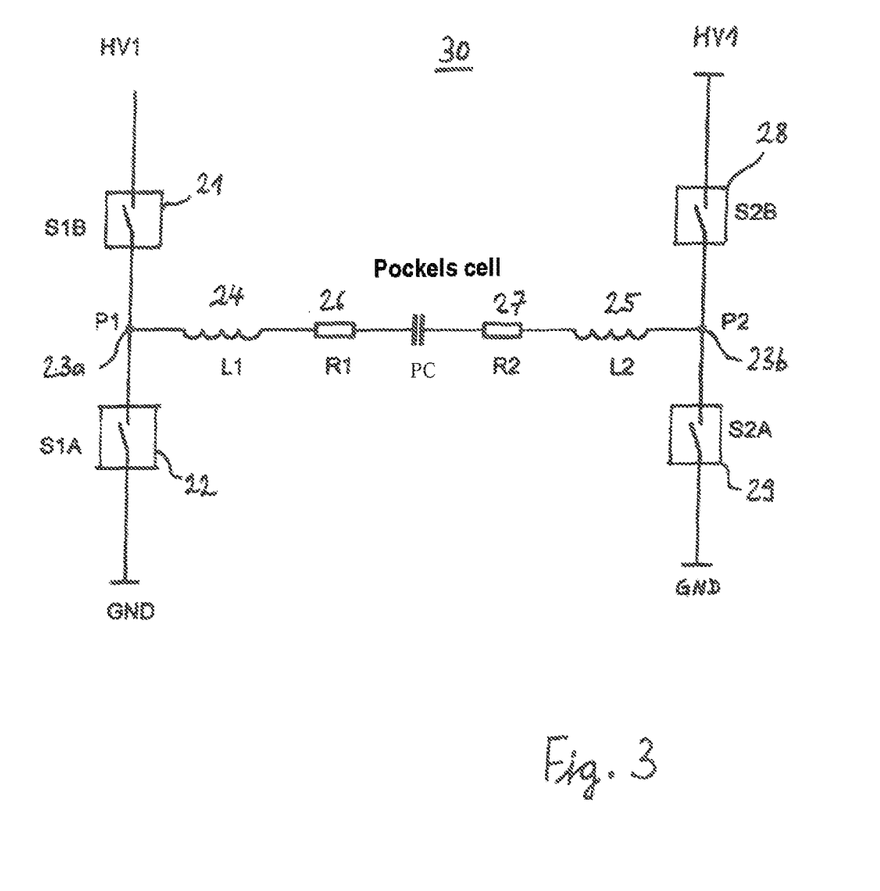
FIG. 3 shows a schematic illustration of a driver circuit in the form of a bridge circuit in the dpp mode in accordance with one embodiment without capacitors or diodes.

FIG. 3 schematically illustrates a driver circuit in the form of a bridge circuit in accordance with one embodiment. The bridge circuit 30 substantially consists of a so-called H configuration. This H configuration comprises two circuit nodes 23a (P1) and 23b (P2), which are to be connected to the electrical terminals of a Pockels cell (PC). The first circuit node 23a is to be connected to a first terminal of the Pockels cell PC by a first line via a first inductance 24 (L1) and a first resistance 26 (R1). The second circuit node 23b is connected to the second terminal of the Pockels cell PC by a second line via a second inductance 25 (L2) and a second resistance 27 (R2). The circuit nodes 23a and 23b are moreover the starting point of four further lines corresponding to the four legs of the letter H. The first circuit node 23a is connected to a first electrical potential HV1 by a third line via a first switching unit 21 (S1B) and is connected to a second electrical potential such as a ground terminal GND by a fourth line via a second switching unit 22 (S1A), while the second circuit node 23b is connected to the first electrical potential HV1 by a fifth line via a third switching unit 28

(S2B) and is connected to the second electrical potential such as the ground terminal GND by a sixth line via a fourth switching unit 29 (S2A).

The same statements as in respect of the switching units of the above-described push-pull circuits in FIGS. 1 and 2 hold true for the switching units 21, 22, 28 and 29.

Figure 4:
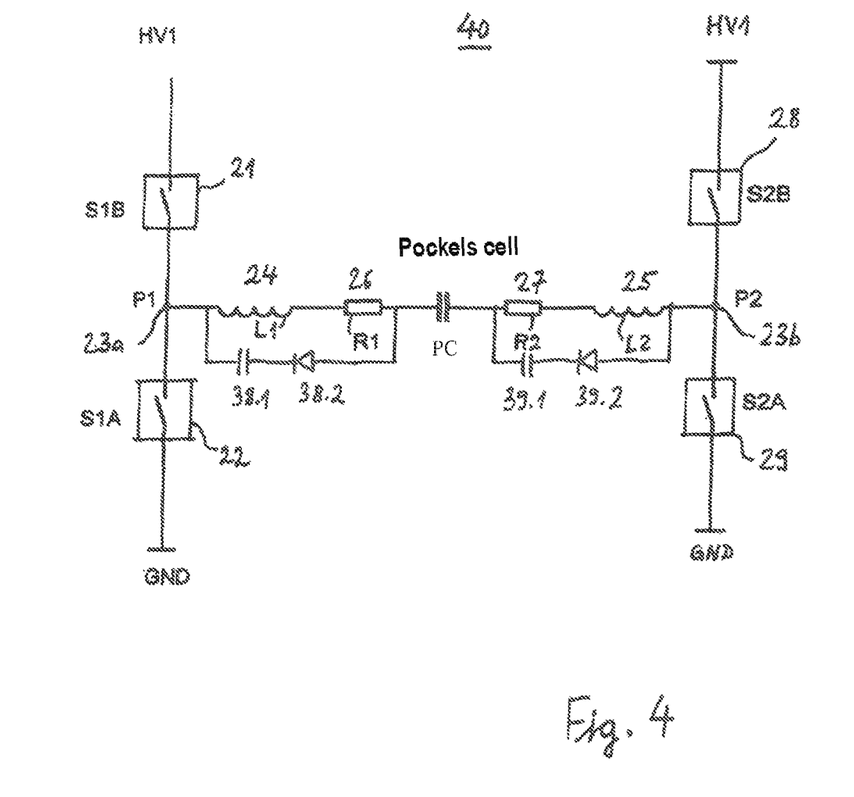
FIG. 4 shows a schematic illustration of a driver circuit in the form of a bridge circuit in the dpp mode in accordance with one embodiment with capacitors and/or diodes.

FIG. 4 schematically illustrates one embodiment of a driver circuit in the form of a bridge circuit. The embodiment 40 in FIG. 4 differs from the embodiment in FIG. 3 merely in that a first capacitor 38.1 and/or a first diode 38.2 are/is connected in parallel with the series circuit formed by the first inductance 24 and the first resistance 26, and a second capacitor 39.1 and/or a second diode 39.2 are/is connected in parallel with the series circuit formed by the second inductance 25 and the second resistance 27. The same statements as made further above concerning the corresponding components in FIG. 2 hold true with regard to the capacitors 38.1, 39.1 and diodes 38.2, 39.2.

Figure 5:
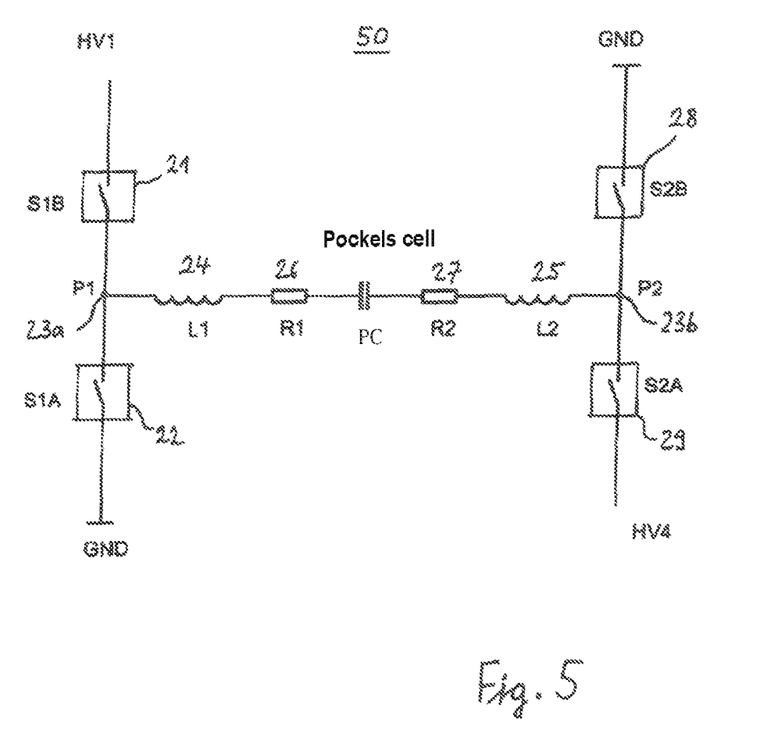
FIG. 5 shows a schematic illustration of a driver circuit in the form of a bridge circuit in a first embodiment of a bpp mode without capacitors or diodes.

FIG. 5 schematically illustrates a driver circuit in the form of a bridge circuit in accordance with a further embodiment. The bridge circuit 50 substantially corresponds to the bridge circuit 30 in FIG. 3, but differs therefrom with regard to the electrical potentials supplied. The first electrical potential HV1 can be provided for example by a positive electrical potential +HV of the positive pole of a high-voltage source. The second electrical potential is given here by a ground potential GND, and the third electrical potential is likewise given by the ground potential GND. Finally, the fourth electrical potential HV4 can be given by a negative electrical potential −HV of the negative pole of the voltage source.

Figure 6:
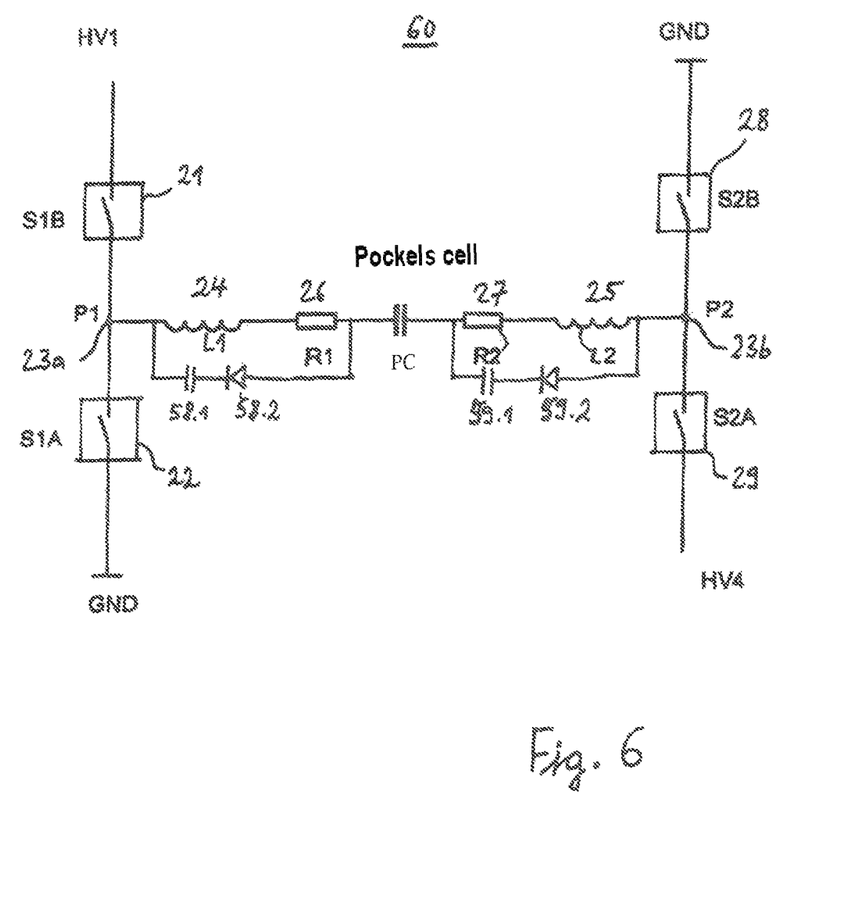
FIG. 6 shows a schematic illustration of a driver circuit in the form of a bridge circuit in the first embodiment of the bpp mode with capacitors and/or diodes.

FIG. 6 schematically illustrates one embodiment of a driver circuit in the form of a bridge circuit. The embodiment 460 in FIG. 6 differs from the embodiment in FIG. 5 merely in that a first capacitor 58.1 and/or a first diode 58.2 are/is connected in parallel with the series circuit formed by the first inductance 24 and the first resistance 26, and a second capacitor 59.1 and/or a second diode 59.2 are/is connected in parallel with the series circuit formed by the second inductance 25 and the second resistance 27. The same statements as made further above concerning the corresponding components in FIG. 2 hold true with regard to the capacitors 58.1, 59.1 and diodes 58.2, 59.2.

Figure 7:
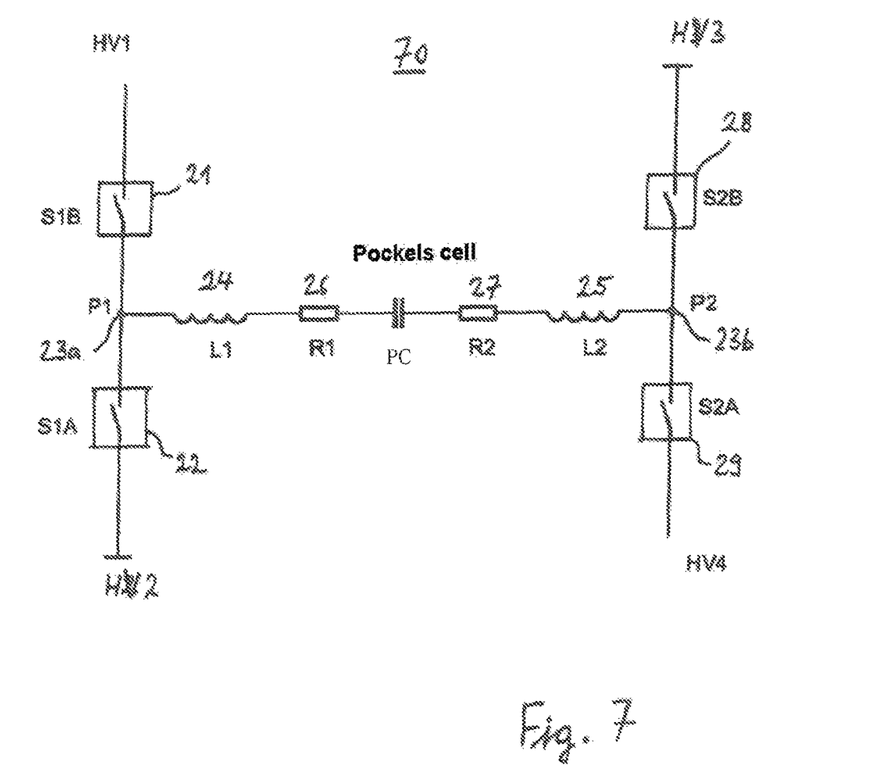
FIG. 7 shows a schematic illustration of a driver circuit in the form of a bridge circuit in a second embodiment of a bpp mode without capacitors or diodes.

FIG. 7 schematically illustrates a driver circuit in the form of a bridge circuit in accordance with a further embodiment. In this embodiment of a bridge circuit 70, the electrical potentials HV1-HV4 are chosen such that the difference between the potentials HV1-HV4 is greater than the difference between the potentials HV1-HV2, and that the difference between the potentials HV1-HV4 is greater than the difference between the potentials HV3-HV4, and that—unlike in the embodiment in FIG. 5—the potentials HV2 and HV3 differ from one another.

Figure 8:
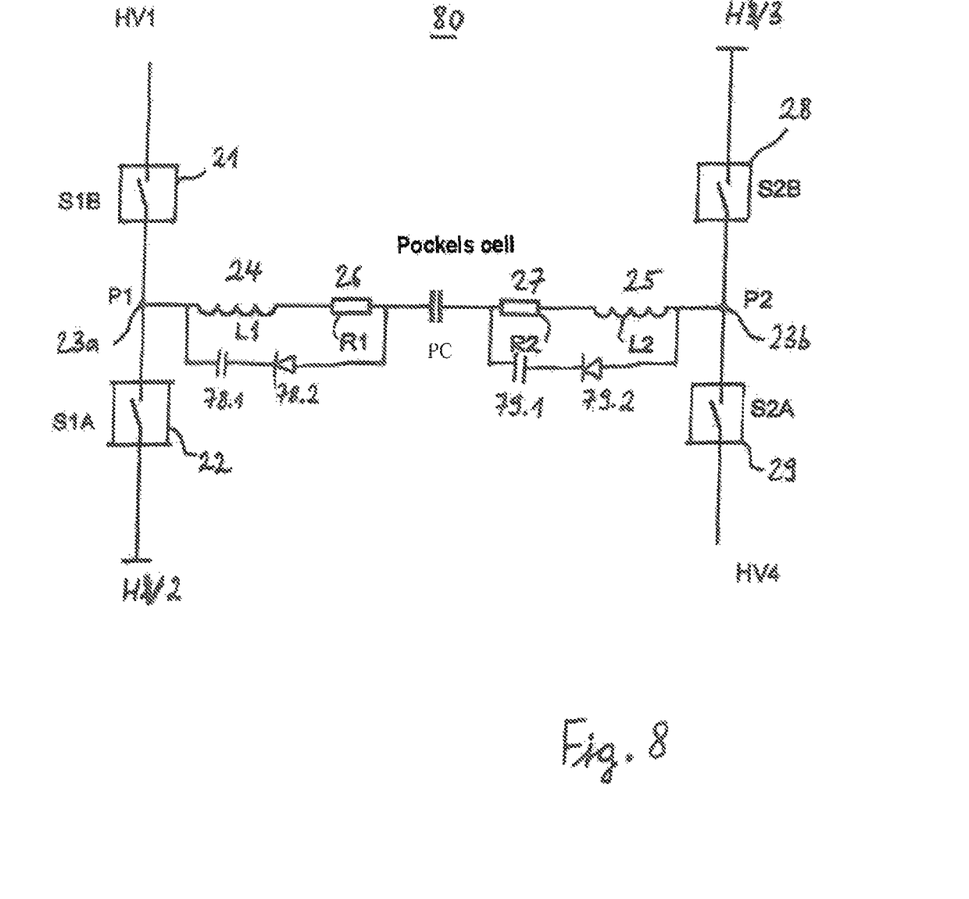
FIG. 8 shows a schematic illustration of a driver circuit in the form of a bridge circuit in the second embodiment of a bpp mode with capacitors and/or diodes.

FIG. 8 schematically illustrates one embodiment of a driver circuit in the form of a bridge circuit. The embodiment 80 in FIG. 8 differs from the embodiment in FIG. 7 merely in that a first capacitor 78.1 and/or a first diode 78.2 are/is connected in parallel with the series circuit formed by the first inductance 24 and the first resistance 26, and a second capacitor 79.1 and/or a first diode 79.2 are/is connected in parallel with the series circuit formed by the second inductance 25 and the second resistance 27. The same statements as made further above concerning the corresponding components in FIG. 2 hold true with regard to the capacitors 78.1, 79.1 and diodes 78.2, 79.2.

The present application likewise relates to a laser system. Such a laser system comprises one or a plurality of Pockels cells, wherein at least one Pockels cell is connected to a driver circuit described in the present application.

In accordance with one embodiment of the laser system according to the invention, said laser system furthermore comprises a laser beam source and one or a plurality of optical amplifiers, wherein at least one Pockels cell is arranged in the beam path upstream of an optical amplifier, downstream of an optical amplifier, or between two optical amplifiers, and in particular said Pockels cell is connected to a driver circuit described in the present application. The laser beam source can be a continuous wave laser beam source, for example, and a first Pockels cell can be arranged in the beam path downstream of the laser beam source and can be configured for generating laser pulses from the continuous wave laser radiation. However, the laser beam source can likewise be a laser beam source operating in pulsed operation with a first repetition rate, and a first Pockels cell can be arranged in the beam path downstream of the laser beam source and can be configured in such a way as to generate from the pulsed laser radiation a pulsed laser radiation with a second repetition rate, which is lower than the first repetition rate. In this case, therefore, the first Pockels cell operates in the pulse picking mode.

Figure 9:
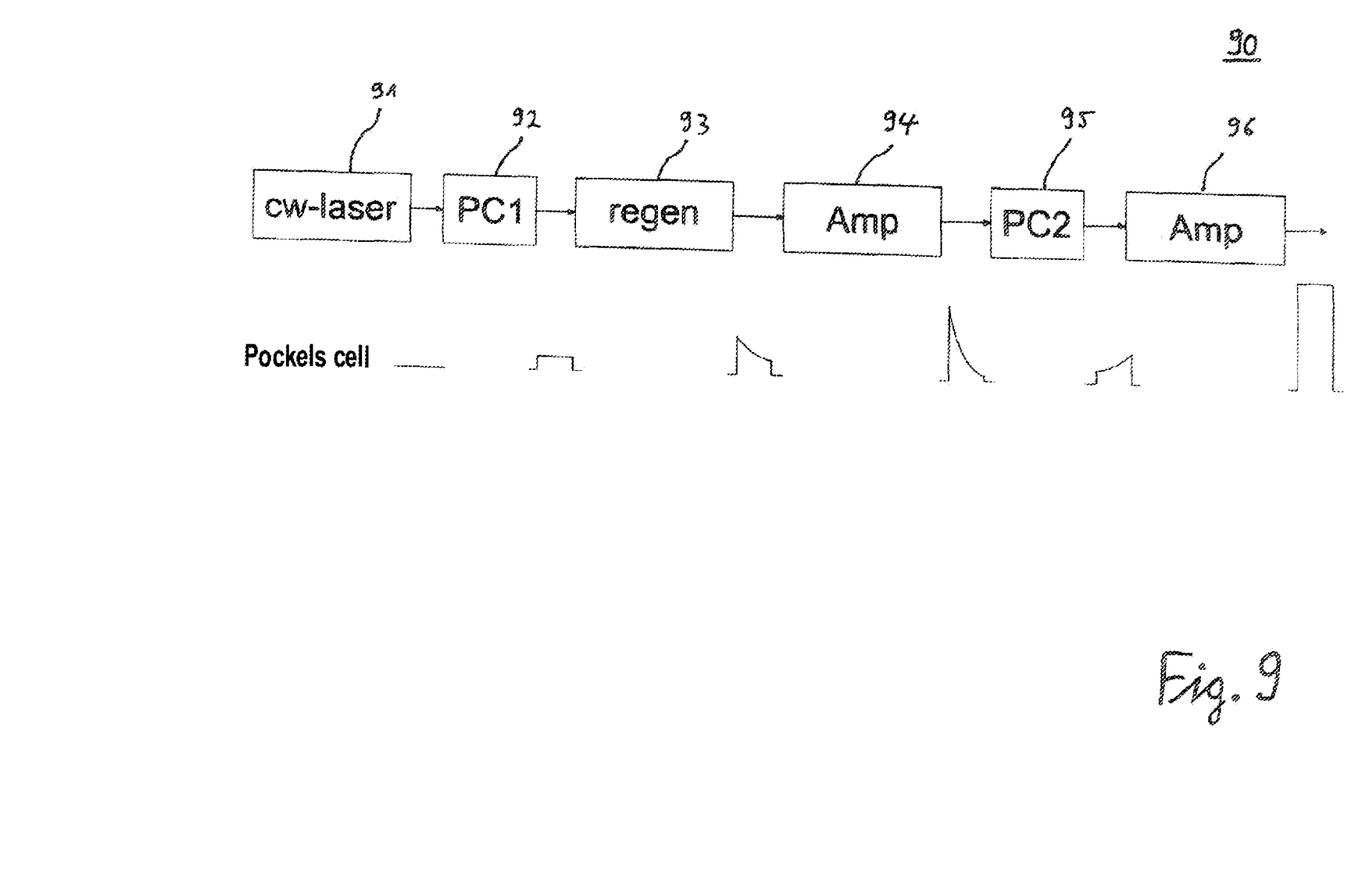
FIG. 9 shows a schematic illustration of a three-stage amplifier chain in which a Pockels cell is driven by a driver circuit disclosed in this application.

FIG. 9 schematically illustrates a 3-stage amplifier chain. The pulse shape of the respective optical laser beam pulses is illustrated symbolically below the units of the amplifier chain illustrated as blocks.

At its beginning, the amplifier chain 90 has a laser beam source 91 operating in continuous wave (cw) mode, for example a $CO_2$ laser beam source. The cw output radiation of the laser beam source 91 is fed to a first Pockels cell 92, which is arranged between two crossed polarizers (not illustrated) and converts the cw laser radiation into a pulsed laser radiation having approximately rectangular laser pulses. For this purpose, the first Pockels cell 92 is driven by a conventional driver circuit, by which customary switch-on and switch-off times in the nanoseconds range, that is to say in the range of 1 ns to 10 ns, can be obtained. The pulse repetition rate can be adjustable in a wide range between 1 kHz and 100 MHz and the pulse length can be adjustable for example in a wide range of 5 ns to 1 µs.

The laser pulses generated by the first Pockels cell 92 can then be fed to a first optical amplifier 93, which can be embodied as a so-called regenerative amplifier. The latter constitutes a specific design of an optical amplifier which has a resonator and a gain medium which is arranged within the resonator and in which a population inversion is generated. The laser pulse coupled into the regenerative amplifier 93 passes repeatedly through the resonator and depletes part of the population inversion during each pass and is amplified in the process. As soon as the energy stored in the gain medium as a result of the population inversion has been sufficiently reduced, amplification no longer takes place and the laser pulse is coupled out again from the resonator. Gain factors in the range of from $10^4$ to $10^6$ can typically be achieved in the regenerative amplifier 93.

The pulse shape of the laser pulse emerging from the regenerative amplifier 93, said pulse shape being shown schematically in the lower part of FIG. 9, already indicates the problem of gain depletion indicated further above. The previously rectangular laser pulse is deformed by the gain depletion in such a way that an exponentially falling section of the radiation intensity arises between the fast rising and falling pulse edges, it being necessary to compensate for said section in the further progression.

After emerging from the regenerative amplifier 93, the laser pulses enter a further optical amplifier 94. This optical amplifier 94 likewise has a gain medium which is put into a population inversion state by means of a suitable optical or electrical excitation. For the rest, however, the optical amplifier 94 is of a design such that a laser pulse to be amplified is amplified by a single pass through the gain medium. Gain depletion likewise occurs when the laser pulse passes through the optical amplifier 94. As is shown on the basis of the pulse shape of the laser pulse emerging from the optical amplifier 94 in the lower part of FIG. 9, as a result the laser pulse is deformed to an even greater extent in the direction of a great rise in the radiation intensity and an almost equally great exponential fall in the radiation intensity over the entire pulse duration. The optical amplifier 94 can be designed such that a gain factor of $10^9$ is achievable.

The objective, then, is to reverse this deformation of the laser pulse in the third and final amplifying stage. For this purpose, the laser pulse is fed to a second Pockels cell 95, which is arranged between two crossed polarizers and which can then be driven by means of a driver circuit in the manner as has been described further above. The driving of the Pockels cell 95 and the passage of the laser pulse through the Pockels cell 95 driven in this way bring about a deformation of the laser pulse in such a way that the latter has a fast rising edge in the nanoseconds range, an exponentially rising central section and a rapidly falling edge in the nanoseconds range.

The laser pulse deformed in this way is then fed to a third optical amplifier 96. The latter can in principle be constructed in the same way as or in a similar manner to the second optical amplifier 94, such that in this optical amplifier, too, a gain depletion occurs for a laser pulse passing through. However, since said laser pulse has now been deformed as described above, such that it does not have a high radiation intensity in the initial region, the gain cannot be reduced as rapidly either. As a result, a laser pulse is obtained which, as shown in the lower part of FIG. 9, after passing through the optical amplifier 96, has an ideally rectangular profile, at any rate one having rising and falling edges in the nanoseconds range and between them a section having a substantially constant radiation intensity. The optical amplifier 96 can be designed such that a gain factor of $10^9$ is achievable.

In accordance with one embodiment of a laser system, the latter comprises a laser beam source with a laser resonator containing a resonator-internal Pockels cell. The Pockels cell is driven by a driver circuit described in this application in such a way that it acts as a cavity dumper.

Figure 10:
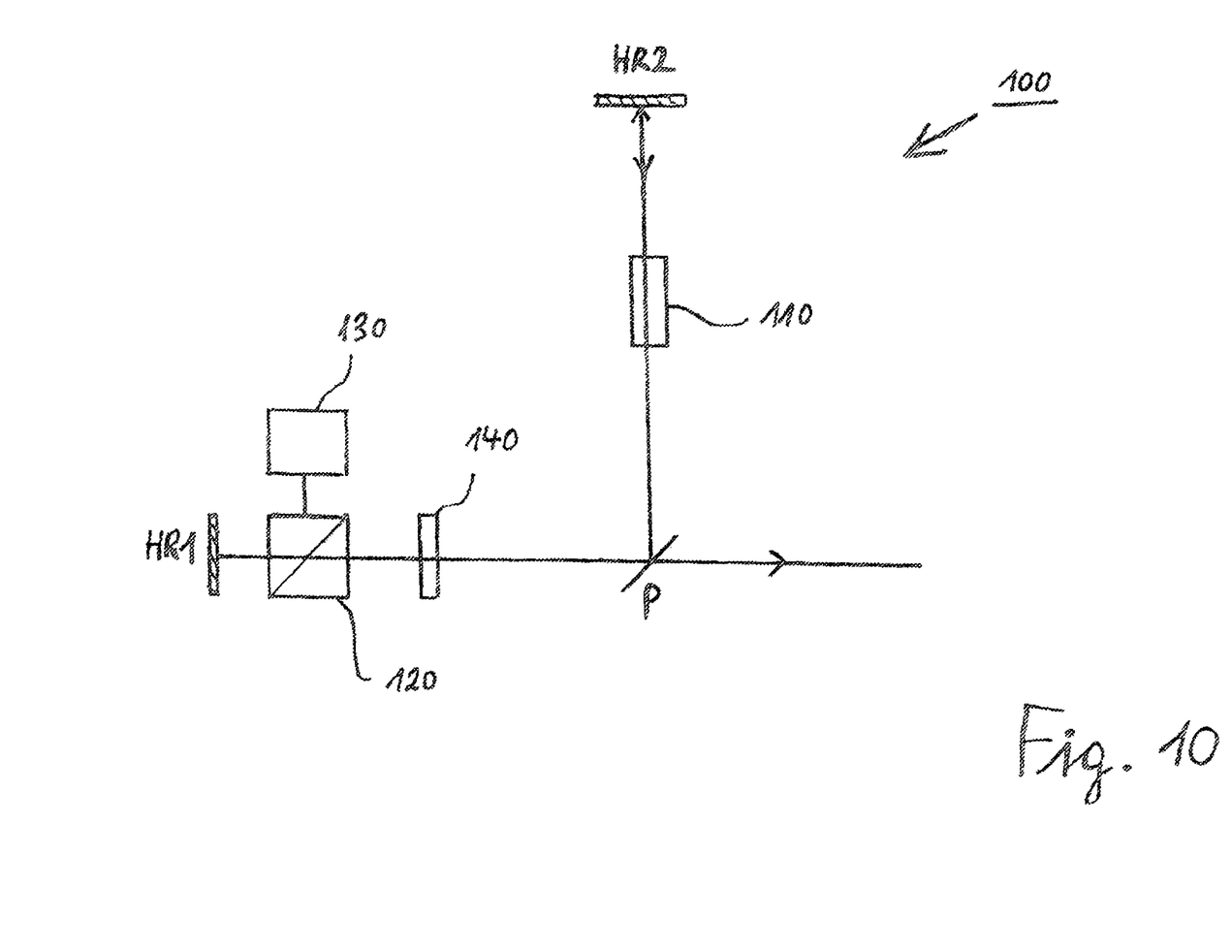
FIG. 10 shows a schematic illustration of one embodiment of a laser beam source with a resonator-internal Pockels cell as cavity dumper, which is driven by a driver circuit disclosed in this application.

FIG. 10 schematically illustrates one embodiment of a laser beam source with cavity dumper. The laser beam source 100 has a cw resonator arranged between the highly reflective mirrors HR1 and HR2. A gain medium 110 is situated within the resonator. A Pockels cell 120 is arranged within the resonator in the light path between a polarization-dependent mirror and the first highly reflective end mirror HR1. A lambda/4 plate 140 is arranged upstream of the Pockels cell 120. The polarization-dependent mirror P completely reflects s-polarized light, for example, while it is completely transmissive to p-polarized light. The Pockels cell 120 is connected to a driver circuit 130 described in this application, such as, for instance, a push-pull circuit or a bridge circuit as described further above.

Between two output pulses, the Pockels cell 120 is voltageless and thus optically inactive, such that the for example s-polarized laser radiation coming from the gain medium 110 is reflected at the mirror P and is then p-polarized after passing twice through the Pockels cell 120, lambda/4 plate 140 and reflection at the HR1, and is coupled out by the mirror P. Consequently, no amplification takes place if no voltage is present at the Pockels cell 120. For pulse generation, a voltage is applied to the Pockels cell 120 in such away that the latter, upon double passage, brings about a rotation of the polarization by 90°, which is added together with the polarization rotation by the lambda/4 plate 140 to 0° or 180°. In this state, the resonator is closed, and amplification takes place in the gain medium 110. If the voltage is then slowly removed from the Pockels cell 120, the Pockels cell 120 thus acts together with the mirror P as a time-dependent coupling-out. The driver circuit 130 connected to the Pockels cell 120 can be designed such that at least one of the two switching edges of the voltage pulse is lengthened, such that the laser pulse coupled out from the resonator acquires a desired temporal length and a correspondingly reduced peak intensity. In particular, the driver circuit 130 can contain a diode in one or both lines. The diode can be implemented with regard to the polarity thereof such that at the instant t0 of the voltage being switched on the diode is forward-biased and the full voltage jump is transferred to the Pockels cell PC, and that at the instant t1 of the voltage being switched off the diode is reverse-biased, as a result of which firstly only part of the voltage jump is transferred to the Pockels cell PC, and then the Pockels cell is slowly discharged, such that the coupled-out laser pulse is widened in accordance with the mode of operation of the cavity dumper.

While the invention has been illustrated and described with regard to one or more implementations, amendments and/or modifications can be made to the examples illustrated, without departing from the concept and scope of protection of the accompanying claims. In particular, with regard to the different functions carried out by the components or structures described above, the expressions described for describing such components, unless indicated otherwise, are intended to correspond to an arbitrary component or structure which carries out the specified function of the described component (which is e.g. functionally equivalent), even if it is not structurally equivalent to the disclosed structure which carries out the function in the exemplary implementations of the invention as illustrated herein.

The invention claimed is:

1. A driver circuit for a Pockels cell, comprising:
    a first line, which is to be connected to a first terminal of the Pockels cell; and
    a second line, which is to be connected to a second terminal of the Pockels cell, wherein:
        one or both of the first line and the second line has/have an inductance (L1, L2), in particular, an inductance (L1, L2) or an inductance component (L1, L2) is incorporated into the first line and/or the second line; and
        one or both of the first line and the second line has/have a capacitor or capacitor component connected in parallel with the inductance (L1, L2) and/or a diode connected in parallel with the inductance (L1, L2).

2. The driver circuit as claimed in claim 1, wherein inductance values of the inductance or inductances (L1, L2) and/or capacitance values of the capacitor or capacitors are dimensioned such that a voltage pulse having a rising edge in nanoseconds range, an exponentially rising section adjacent thereto and a falling edge adjacent thereto in the nanoseconds range is generatable by the driver circuit.

3. The driver circuit as claimed in claim 1, wherein one or both of the first line and the second line has/have a resistance or resistance component (R1, R2) connected in series with the inductance or inductances (L1, L2).

4. The driver circuit as claimed in claim 1, wherein an inductance value of one or both of the inductances (L1, L2) is in a range of 1 µH to 100 mH.

5. The driver circuit as claimed in claim 1, wherein a capacitance value of the capacitor or capacitors is in a range of ≤0.1 nF.

6. The driver circuit as claimed in claim 1, wherein an inductance value of one or both of the inductances (L1, L2) is adjustable.

7. The driver circuit as claimed in claim 1, further comprising:
a circuit node (P1) connected to the first line, wherein:
the circuit node is to be connected to a first potential (HV1) by a third line via a first switching unit (S1B),
the circuit node is to be connected to a second potential (HV2) by a fourth line via a second switching unit (S1A), and
the second line is to be connected to the second potential (HV2).

8. The driver circuit as claimed in claim 1, further comprising:
a first circuit node (P1) connected to the first line, wherein:
the first circuit node is to be connected to a first potential (HV1) by a third line via a first switching unit (S1B), and
the first circuit node is to be connected to a second potential (HV2) by a fourth line via a second switching unit (S1A); and
a second circuit node (P2), which is to be connected to the second terminal of the Pockels cell by the second line, wherein:
the second circuit node is to be connected to a third potential (HV1; GND; HV3) by a fifth line via a third switching unit (S2B), and
the second circuit node is to be connected to a fourth potential (GND; HV4) by a sixth line via a fourth switching unit (S2A).

9. A Pockels cell comprising a driver circuit as claimed in claim 1.

10. A laser system, comprising:
at least one Pockels cell comprising a driver circuit as claimed in claim 1.

11. The laser system as claimed in claim 10, further comprising:
a laser beam source; and
one or a plurality of optical amplifiers, wherein at least one Pockels cell is arranged in a beam path upstream of an optical amplifier.

12. The laser system as claimed in claim 11, wherein:
the laser beam source is a continuous wave laser beam source, and
a first Pockels cell is arranged in the beam path downstream of the laser beam source and is configured to generate laser pulses from continuous wave laser radiation emitted by the continuous wave laser beam source.

13. The laser system as claimed in 12, wherein:
an optical amplifier in the form of a regenerative amplifier is arranged in the beam path downstream of the first Pockels cell.

14. The laser system as claimed in claim 11, wherein:
the laser beam source is a laser beam source operating in pulsed operation with a first repetition rate, and
a first Pockels cell is arranged in the beam path downstream of the laser beam source and is configured to generate, from pulsed laser radiation emitted by the laser beam source, pulsed laser radiation with a second repetition rate, which is lower than the first repetition rate.

15. The laser system as claimed in claim 11, further comprising:
at least one Pockels cell comprising a driver circuit which is configured such that a voltage pulse having a rising edge in nanoseconds range, an exponentially rising section adjacent thereto and a falling edge adjacent thereto in the nanoseconds range is generatable by said driver circuit.

16. The laser system as claimed in claim 10, further comprising:
a laser beam source with a laser resonator comprising a Pockels cell comprising a driver circuit which is configured such that the Pockels cell acts as a cavity dumper.

17. A driver circuit for a Pockels cell, comprising:
a first line, which is to be connected to a first terminal of the Pockels cell; and
a second line, which is to be connected to a second terminal of the Pockels cell, wherein:
one or both of the first line and the second line has/have an inductance (L1, L2), in particular, an inductance (L1, L2) or an inductance component (L1, L2) is incorporated into the first line and/or the second line; and
one or both of the first line and the second line has/have a resistance or resistance component (R1, R2) connected in series with the inductance or inductances (L1, L2).

18. A driver circuit for a Pockels cell, comprising:
a first line, which is to be connected to a first terminal of the Pockels cell; and
a second line, which is to be connected to a second terminal of the Pockels cell, wherein:
one or both of the first line and the second line has/have an inductance (L1, L2), in particular, an inductance (L1, L2) or an inductance component (L1, L2) is incorporated into the first line and/or the second line; and
an inductance value of one or both of the inductances (L1, L2) is in a range of 1 µH to 100 mH.

19. A driver circuit for a Pockels cell, comprising:
a first line, which is to be connected to a first terminal of the Pockels cell; and
a second line, which is to be connected to a second terminal of the Pockels cell, wherein:
one or both of the first line and the second line has/have an inductance (L1, L2), in particular, an inductance (L1, L2) or an inductance component (L1, L2) is incorporated into the first line and/or the second line; and
an inductance value of one or both of the inductances (L1, L2) is adjustable.

20. A driver circuit for a Pockels cell, comprising:
a first line, which is to be connected to a first terminal of the Pockels cell;
a second line, which is to be connected to a second terminal of the Pockels cell, wherein one or both of the first line and the second line has/have an inductance (L1, L2), in particular, an inductance (L1, L2) or an inductance component (L1, L2) is incorporated into the first line and/or the second line; and
a circuit node (P1) connected to the first line, wherein:

the circuit node is to be connected to a first potential (HV1) by a third line via a first switching unit (S1B),
the circuit node is to be connected to a second potential (HV2) by a fourth line via a second switching unit (S1A), and
the second line is to be connected to the second potential (HV2).

21. A driver circuit for a Pockels cell, comprising:
a first line, which is to be connected to a first terminal of the Pockels cell;
a second line, which is to be connected to a second terminal of the Pockels cell, wherein one or both of the first line and the second line has/have an inductance (L1, L2), in particular, an inductance (L1, L2) or an inductance component (L1, L2) is incorporated into the first line and/or the second line;
a first circuit node (P1) connected to the first line, wherein:
the first circuit node is to be connected to a first potential (HV1) by a third line via a first switching unit (S1B), and
the first circuit node is to be connected to a second potential (HV2) by a fourth line via a second switching unit (S1A); and
a second circuit node (P2), which is to be connected to the second terminal of the Pockels cell by the second line, wherein:
the second circuit node is to be connected to a third potential (HV1; GND; HV3) by a fifth line via a third switching unit (S2B), and
the second circuit node is to be connected to a fourth potential (GND; HV4) by a sixth line via a fourth switching unit (S2A).

22. A laser system, comprising:
at least one Pockels cell comprising a driver circuit comprising:
a first line, which is to be connected to a first terminal of the Pockels cell; and
a second line, which is to be connected to a second terminal of the Pockels cell, wherein one or both of the first line and the second line has/have an inductance (L1, L2), in particular, an inductance (L1, L2) or an inductance component (L1, L2) is incorporated into the first line and/or the second line;
a laser beam source; and
one or a plurality of optical amplifiers, wherein at least one Pockels cell is arranged in the beam path upstream of an optical amplifier.

23. A laser system, comprising:
at least one Pockels cell comprising a driver circuit comprising:
a first line, which is to be connected to a first terminal of the Pockels cell; and
a second line, which is to be connected to a second terminal of the Pockels cell, wherein one or both of the first line and the second line has/have an inductance (L1, L2), in particular, an inductance (L1, L2) or an inductance component (L1, L2) is incorporated into the first line and/or the second line; and
a laser beam source with a laser resonator comprising a Pockels cell comprising a driver circuit which is configured such that the Pockels cell acts as a cavity dumper.

* * * * *

UNITED STATES PATENT AND TRADEMARK OFFICE
CERTIFICATE OF CORRECTION

| | |
|---|---|
| PATENT NO. | : 9,703,126 B2 |
| APPLICATION NO. | : 14/949038 |
| DATED | : July 11, 2017 |
| INVENTOR(S) | : Thorald Horst Bergmann |

It is certified that error appears in the above-identified patent and that said Letters Patent is hereby corrected as shown below:

On the Title Page

In item (73) titled Assignee, please insert the second assignee as follows:
--Hemholtz-Zentrum Dresden-Rossendorf E.V., Dresden (DE)--

Signed and Sealed this
Nineteenth Day of September, 2017

Joseph Matal
*Performing the Functions and Duties of the*
*Under Secretary of Commerce for Intellectual Property and*
*Director of the United States Patent and Trademark Office*